(12) United States Patent
Schrödinger et al.

(10) Patent No.: US 6,643,301 B2
(45) Date of Patent: Nov. 4, 2003

(54) CONTROL DEVICE FOR LASER DIODES

(75) Inventors: Karl Schrödinger, Berlin (DE); Toralf Oheim, Hennigsdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/113,350

(22) Filed: Apr. 1, 2002

(65) Prior Publication Data

US 2002/0131459 A1 Sep. 19, 2002

Related U.S. Application Data

(63) Continuation of application No. PCT/DE00/03523, filed on Sep. 28, 2000.

(30) Foreign Application Priority Data

Sep. 30, 1999 (DE) .......................................... 199 48 689

(51) Int. Cl.[7] .................................................. H01S 3/13
(52) U.S. Cl. .................................... 372/29.011; 372/38
(58) Field of Search ............................. 372/29.011, 38; 350/205; 347/129; 455/609

(56) References Cited

U.S. PATENT DOCUMENTS

| 4,369,525 A | | 1/1983 | Breton et al. | |
|---|---|---|---|---|
| 4,558,465 A | * | 12/1985 | Siegel et al. | ................ 455/609 |
| 4,709,416 A | * | 11/1987 | Patterson | .................... 455/609 |
| 4,884,279 A | | 11/1989 | Odagiri | |
| 5,153,765 A | | 10/1992 | Grunziger | |
| 5,287,375 A | | 2/1994 | Fujimoto | |
| 5,502,298 A | * | 3/1996 | Geller | ........................ 250/205 |
| 5,579,328 A | | 11/1996 | Habel et al. | |
| 5,675,600 A | * | 10/1997 | Yamamoto et al. | ........... 372/38 |
| 5,850,409 A | | 12/1998 | Link | |
| 5,912,694 A | * | 6/1999 | Miyake et al. | ............... 347/129 |

FOREIGN PATENT DOCUMENTS

| DE | 38 17 836 A1 | 11/1989 |
|---|---|---|
| DE | 41 09 957 A1 | 10/1992 |
| DE | 41 28 284 A1 | 3/1993 |
| DE | 195 03 410 A1 | 8/1996 |
| JP | 63 314 877 | 12/1988 |
| WO | WO 91/11838 | 8/1991 |

OTHER PUBLICATIONS

Smith, D. W. et al.: "Laser Level Control for High BIT Rate Optical Fibre Systems", XP–000955403, IEEE, 1980, pp. 926–930.

* cited by examiner

*Primary Examiner*—Paul Ip
*Assistant Examiner*—Tuan M Nguyen
(74) *Attorney, Agent, or Firm*—Laurence A. Greenberg; Werner H. Stemer; Gregory L. Mayback

(57) ABSTRACT

A device for adjusting laser diodes includes a pilot signal adjustment device for adjusting the signal current using a pilot signal frequency that is modulated onto the signal current. The device includes a bias direct current source supplying the laser diode with a bias direct current. A switching device switches the adjustment device between a state where the pilot signal adjustment device is connected to the modulator and the bias direct current source such that the signal current can be adjusted using the pilot signal adjustment device, and another state where the modulator is connected to the temperature compensation device such that the signal flow can be adjusted and/or controlled by the temperature compensation device.

13 Claims, 1 Drawing Sheet

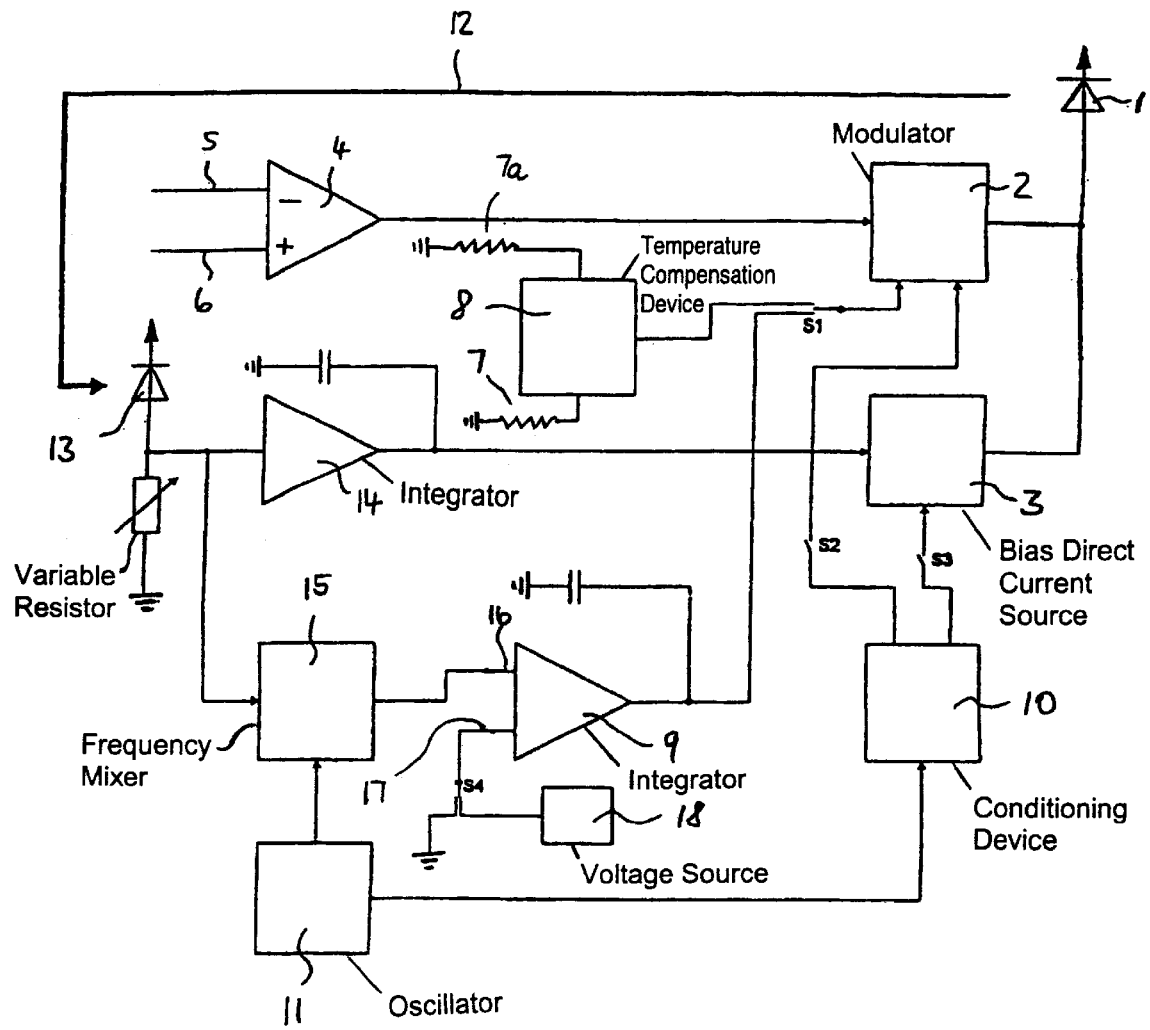

CONTROL DEVICE FOR LASER DIODES

CROSS-REFERENCE TO RELATED APPLICATION

This application is a continuation of copending International Application No. PCT/DE00/03523, filed Sep. 28, 2000, which designated the United States.

BACKGROUND OF THE INVENTION

Field of the Invention

The invention relates to a control device for a laser diode. The control device includes a bias direct current source supplying a bias direct current to the laser diode. The control device includes a modulator for modulating a signal current for the laser diode in accordance with a data signal received by the modulator. The control device also includes a temperature compensation device that can be connected to the modulator such that the signal current can be regulated and/or controlled as a function of temperature changes.

Laser diodes are used for the fast transmission of digital, optical signals, in particular, because they have a narrow spectral width and the capacity for fast modulation. In the case of such laser diodes, deviations from a predefined characteristic curve occur during operation, depending for example, on the age of the laser diode or on the temperature. Depending on how the laser diode is used, various control mechanisms are used in order to compensate for the deviations from the characteristic curve.

These control mechanisms include using a temperature compensation device. Regulation of this type is necessary since the current threshold value $I_s$ of the characteristic curve of a laser diode, at which the characteristic curve changes from a region of the bias direct current (no light emission) into a region of the signal current (light emission region), is temperature dependent. Using the temperature compensation device, the bias direct current of the laser diode can be regulated in such a way that the laser diode always operates in the region of the signal current. The disadvantage of this type of control is that no regulation of the modulated signal current is carried out, so that, for example, changes in the characteristic curve, in particular with regard to the slope as a consequence of the aging of the laser diode, or on account of temperature changes, cannot be compensated for. The influence of such characteristic curve changes can be reduced, preferably ruled out, by using a pilot tone control device.

A pilot tone control device is known, for example, from the publication by D. W. Smith and T. G. Hodgkinson entitled, "Laser level control for optical fiber systems with high bit rate", symposium, Houston, April 1980. A distinction is drawn between pilot tone control to the high level of the signal current from the laser diode and pilot tone control to the high and the low level of the signal current. In principle, in this case a pilot tone frequency is modulated onto the signal current (pilot tone control on the high level) or onto the signal current and the direct current (pilot tone control on the high and the low level). Using a monitor diode, part of the light emitted is registered. The registered part of the light is evaluated in order to carry out a readjustment in the event of deviations with regard to the mean output power of the laser diode and the pilot tone amplitude. The disadvantage with pilot tone control to the high and the low level is that at high data rates, because of the modulation of the signal current in the region of the threshold current $I_s$, at which the characteristic curve of the laser diode bends, jitter is promoted. This can be avoided by using pilot tone control at the high level of the signal current.

SUMMARY OF THE INVENTION

It is accordingly an object of the invention to provide a control device for a laser diode which overcomes the above-mentioned disadvantages of the prior art apparatus of this general type.

In particular, it is an object of the invention to provide a control device for a laser diode with which the possibilities of using the various control mechanisms are improved.

With the foregoing and other objects in view there is provided, in accordance with the invention, a control device for at least one laser diode, including: a bias direct current source connected to the laser diode and providing a bias direct current to the laser diode; a modulator for modulating a signal current for the laser diode in accordance with a data signal received by the modulator; a temperature compensation device switchably connected to the modulator such that the signal current can be operated on, as a function of temperature changes, in a manner selected from the group consisting of being regulated and being controlled; a pilot tone control device for controlling the signal current by modulating a pilot tone frequency onto the signal current; and a first switching device for switching between a first state and a second state. In the first state, the pilot tone control device is connected to the modulator and the bias direct current source such that the signal current can be regulated using the pilot tone control device. In the second state, the modulator is connected to the temperature compensation device such that the temperature compensation device operates on the signal current in a manner selected from the group consisting of regulating the signal current and controlling the signal current.

In accordance with an added feature of the invention, the pilot tone control device includes a second switching device for changing the pilot tone control device between a state for controlling at a high level of the signal current, and another state for controlling at a low level of the signal current and at the high level of the signal current.

In accordance with an additional feature of the invention, the second switching device includes programmable switches.

In accordance with another feature of the invention, the second switching device is controlled using a switching signal having a low level and a high level.

In accordance with a further feature of the invention, the pilot tone control device includes: a monitor diode for receiving a monitor signal; a first integrator connected to the monitor diode and to the bias direct current source; an oscillator for generating the pilot tone frequency; a connection between the monitor diode and the first integrator; a frequency mixing device coupled to the connection between the monitor diode and the first integrator, the frequency mixing device coupled to the oscillator; a conditioning device receiving the pilot tone frequency from the oscillator and conditioning the pilot tone frequency, the conditioning device having a first output switchably connected to the modulator, the conditioning device having a second output switchably connected to the bias direct current source; and a second integrator connected to the frequency mixing device, the second integrator having an output switchably connected to the modulator.

In accordance with a further added feature of the invention, the second integrator has an input; the second switching device has a switching state connecting the input of the second integrator to the reference voltage device to set the pilot tone control device into the state for controlling at the high level of the signal current; and the second switching device has another switching state connecting the input of the second integrator to a ground potential to set the pilot tone control device into the other state for controlling at the low level of the signal current and at the high level of the signal current.

In accordance with another added feature of the invention, the first switching device includes a first switch coupled between the output of the second integrator and the modulator; the first switching device includes a second switch coupled between the first output of the conditioning device and the modulator; and the first switching device includes a third switch coupled between the second output of the conditioning device and the bias direct current source.

In accordance with yet an added feature of the invention, there is provided, a reference voltage device, and a second switching device. The second integrator has an input. The pilot tone control device has two states. The second switching device has a first switching state and a second switching state. In the first switching state, the second switching device connects the input of the second integrator to the reference voltage device to set the pilot tone control device into one of the two states of the pilot tone control device. In the second switching state, the second switching device connects the input of the second integrator to a ground potential to set the pilot tone control device into another one of the two states of the pilot tone control device.

In accordance with yet an additional feature of the invention, the control device controls a plurality of laser diodes.

In accordance with yet another feature of the invention, the first switching device includes programmable switches.

In accordance with an added feature of the invention, the first switching device is controlled using a switching signal having a low level and a high level.

The object of the invention is achieved by providing a pilot tone control device for controlling the signal current by modulating a pilot tone frequency onto the signal current, and also by providing a switching device for switching the control device between one state and another state. In one state, the pilot tone control device is connected to the modulator and the bias direct current source such that the signal current can be regulated using the pilot tone control device. In the other state, the modulator is connected to the temperature compensation device such that the signal current can be regulated and/or controlled using the temperature compensation device.

The substantial advantage achieved with the invention as compared with the prior art consists in the fact that by using a single control device, the benefit of two of the above-described different control mechanisms for laser diodes can be used. Depending on the particular application, it is therefore possible for the control mechanism beneficial to the application to be selected and used.

In an expedient development of the invention, the pilot tone control device includes a second or further switching device, so that the pilot tone control device can be switched between a state in which it is possible to control at a high level of the signal current and another state in which it is possible to control at both the low level and the high level of the signal current. In this way, when using a single control device, it is possible to select between three possible control mechanisms.

One advantageous refinement of the invention provides for the pilot tone control device to include the following components: a monitor diode for receiving a monitor signal; a first integrator that is connected to the monitor diode and the bias direct current source; a frequency mixing device that is coupled to a connection between the monitor diode and the first integrator and to an oscillator device for producing the pilot tone frequency; and a conditioning device for conditioning the pilot tone frequency received from the oscillator device. It is possible for one output of the conditioning device to be connected to the modulator, and for another output of the conditioning device to be connected to the bias direct current source. A second integrator is connected to the frequency mixing device and has an output that can be connected to the modulator. This makes it possible to construct an embodiment of the control device by using simple circuit devices.

Expediently, one input of the second integrator can be connected to the further switching device. The input can be coupled to a reference voltage device or to a ground potential using the further switching device, as a function of a switching state of the further switching device, in order to be able to set the pilot tone control device into one state or the other state. By this arrangement, and by using simple components, a possible way of switching the pilot tone control device between two states is provided.

In a development of the invention, the switching device and/or the further switching device are constructed as programmable switches, which provides a possible route for externally controlling the switching device and the further switching device.

The switching device and/or the further switching device can advantageously be controlled using a high or a low level of a switching signal. This makes it possible to control the switching device and the further switching device using simple circuit components.

A development of the invention provides for the switching device to include a first switch coupled between the output of the second integrator and the modulator. The switching device also includes a second switch coupled between one output of the conditioning device and the modulator, and a third switch coupled between another output of the conditioning device and the bias direct current source. By this arrangement, the components of the pilot tone control device can substantially be separated completely from the control device, so that in the case of using temperature compensation, disruptive influences from the components of the pilot tone control device are reduced.

In an expedient refinement of the invention, the laser diode is replaced by an arrangement of a plurality of laser diodes, as a result of which, the control device can be used, for example, for laser diode arrangements for transmitting a plurality of parallel, optical signals.

Other features which are considered as characteristic for the invention are set forth in the appended claims.

Although the invention is illustrated and described herein as embodied in a control device for laser diodes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The sole drawing FIGURE shows a laser diode and a control device for controlling the laser diode.

DESCRIPTION OF THE PREFERRED EMBODIMENTS

Referring now to the sole drawing FIGURE in detail, there is shown a laser diode 1 that is connected to a modulator 2 and to a bias direct current source 3. The direct current bias source 3 applies a bias direct current to the laser diode 1, so that by using a modulation current, which is generated by the modulator 2, the laser diode 1 can be operated in a characteristic curve region that begins at a threshold current $I_s$. The modulation current is generated in the modulator 2 in accordance with a data signal that the modulator 2 receives from an input stage 4, which has an inverting input 5 and a noninverting input 6. The modulator 2 can be adjusted in terms of amplitude, for example, by using an external resistor 7.

The control device illustrated in FIG. 1 enables three different control mechanisms to be applied to the laser diode 1. Switches S1 to S4 are used to select one of the various control mechanisms such that the selected control mechanism is used when controlling the laser diode.

In a first application, the modulator 2 is connected to a temperature compensation device 8 by the switch S1. The switches S2 and S3 are open in this case. The temperature compensation device 8 enables shifts in the characteristic curve of the laser diode 1, for example with regard to the slope, to be compensated for using the modulation current. To this end, the temperature compensation device 8 has, in particular, a temperature sensor. A temperature coefficient of the modulation current can be adjusted by using a further external resistor 7a.

In a second application, the switch S1, which is switched over as compared with the first application, connects the modulator 2 to a first integrator 9. The switches S2 and S3 are closed, so that the modulator 2 and the bias direct current source 3 are each connected to a conditioning device 10. The conditioning device 10 conditions a pilot tone frequency, which is generated by a local oscillator 11, such that the pilot tone frequency can be modulated onto the bias direct current and the modulation current.

A portion of the optical signal emitted by the laser diode 1 is transmitted to a monitor diode 13 via optical feedback 12 and is converted into an electrical monitor signal. The monitor signal is transmitted to a second integrator 14 and to a frequency mixer 15. The second integrator 14 amplifies the monitor signal and supplies a control signal to the bias direct current source 3 so that the bias direct voltage that is transmitted to the laser diode 1 is regulated. A lower limiting frequency of this control circuit must be lower than the pilot tone frequency which, for example, is 3 kHz and is therefore substantially lower than the normal modulation frequencies of the modulation current which, for example, may be 100 kHz to more than 1 GHz.

In the frequency mixer 15, the pilot tone frequency received by the monitor diode 13 and the pilot tone frequency generated by the local oscillator 11 are mixed, for example, multiplied by one another, so that frequency components that differ from the pilot tone frequency have no effect (synchronous rectifier). The output from the frequency mixer 15 is supplied to an input 16 of the first integrator 9. Another input 17 of the first integrator 9 is connected via the switch S4 to ground potential. The regulation has reached steady state when the output of the frequency mixer 15 is zero, so that no control signal is output from the first integrator 9 to the modulator 2 via the switch S1. This means that the pilot tone amplitude registered using the monitor diode 13 is of the same magnitude at the high and the low level. This application is pilot tone control at a high and a low level of the modulation current.

In a third application, the switch S4 is switched over, as compared with the second application, so that the further input 17 of the first integrator 9 is connected to a reference voltage source 18. Using the reference voltage source 18, a reference signal can be applied to the first integrator 9 from outside. This is pilot tone control at the high level of the modulation current. In the case of the third application, the lower limiting frequency of the control loop must also be lower than the pilot tone frequency.

The control device illustrated in FIG. 1 can be constructed as an integrated circuit that is connected to a laser diode 1 or a configuration of a plurality of laser diodes. Depending on the application for which the laser diode 1 or the laser diode configuration will be used, one of the above-described control mechanisms can be selected by appropriately setting the switches S1 to S4, during the programming of the integrated circuit. In this way, the integrated circuit can be adapted to various applications.

In the case when the switches S1 to S4 are electronically implemented, provision can be made for the switches S1 to S4 to be controlled from outside the integrated circuit by applying a high or a low level of a control signal to a respective pin. This makes a very compact construction of the control device possible, in which the control device needs an external circuit that can be implemented with little expenditure.

A substantial advantage of the control device described consists in the fact that a plurality of components of the control device can be used during the use of different control mechanisms. For example, the control at the high level of the modulation current and the control at the high and the low level of the modulation current are implemented substantially with the same components. The switch S4 connects the further input 17 of the first integrator 9 either to ground potential or to the reference voltage source 18. This minimizes the number of components that are needed to implement the various control mechanisms.

We claim:

1. A control device for at least one laser diode, comprising:

a bias direct current source connected to the laser diode and providing a bias direct current to the laser diode;

a modulator for modulating a signal current for the laser diode in accordance with a data signal received by said modulator;

a temperature compensation device switchably connected to said modulator for controlling the signal current as a function of temperature changes;

a pilot tone control device for controlling the signal current by modulating a pilot tone frequency onto the signal current; and a first switching device for switching between a first state and a second state;

in said first state, said pilot tone control device being connected to said modulator and said bias direct current source for regulating the signal current using said pilot tone control device; and in said second state, said modulator being connected to said temperature compensation device causing said temperature compensation device to control the signal current.

2. The control device according to claim 1, wherein: said pilot tone control device includes a second switching device for changing said pilot tone control device between a state for controlling at a high level of the signal current, and another state for controlling at a low level of the signal current and at the high level of the signal current.

3. The control device according to claim 2, wherein: said second switching device includes programmable switches.

4. The control device according to claim 2, wherein: said second switching device is controlled using a switching signal having a low level and a high level.

5. A control device according to claim 2, wherein said pilot tone control device includes:

a monitor diode for receiving a monitor signal;

a first integrator connected to said monitor diode and to said bias direct current source;

an oscillator for generating the pilot tone frequency;

a connection between said monitor diode and said first integrator;

a frequency mixing device coupled to said connection between said monitor diode and said first integrator, said frequency mixing device coupled to said oscillator;

a conditioning device receiving the pilot tone frequency from said oscillator and conditioning the pilot tone frequency, said conditioning device having a first output switchably connected to said modulator, said conditioning device having a second output switchably connected to said bias direct current source; and a second integrator connected to said frequency mixing device, said second integrator having an output switchably connected to said modulator.

6. The control device according to claim 5, comprising:

a reference voltage device;

said second integrator having an input;

said second switching device having a switching state connecting said input of said second integrator to said reference voltage device to set said pilot tone control device into said state for controlling at the high level of the signal current; and said second switching device having another switching state connecting said input of said second integrator to a ground potential to set said pilot tone control device into said other state for controlling at the low level of the signal current and at the high level of the signal current.

7. The control device according to claim 5, wherein:

said first switching device includes a first switch coupled between said output of said second integrator and said modulator;

said first switching device includes a second switch coupled between said first output of said conditioning device and said modulator; and said first switching device includes a third switch coupled between said second output of said conditioning device and said bias direct current source.

8. A control device according to claim 1, wherein said pilot tone control device includes:

a monitor diode for receiving a monitor signal;

a first integrator connected to said monitor diode and to said bias direct current source;

an oscillator for generating the pilot tone frequency;

a connection between said monitor diode and said first integrator;

a frequency mixing device coupled to said connection between said monitor diode and said first integrator, said frequency mixing device coupled to said oscillator;

a conditioning device receiving the pilot tone frequency from said oscillator and conditioning the pilot tone frequency, said conditioning device having a first output switchably connected to said modulator, said conditioning device having a second output switchably connected to said bias direct current source; and a second integrator connected to said frequency mixing device, said second integrator having an output switchably connected to said modulator.

9. The control device according to claim 8, comprising:

a reference voltage device; and a second switching device;

said second integrator having an input;

said pilot tone control device having two states;

said second switching device having a first switching state and a second switching state;

in said first switching state, said second switching device connecting said input of said second integrator to said reference voltage device to set said pilot tone control device into one of said two states of said pilot tone control device; and in said second switching state, said second switching device connecting said input of said second integrator to a ground potential to set said pilot tone control device into another one of said two states of said pilot tone control device.

10. The control device according to claim 8, wherein:

said first switching device includes a first switch coupled between said output of said second integrator and said modulator;

said first switching device includes a second switch coupled between said first output of said conditioning device and said modulator; and said first switching device includes a third switch coupled between said second output of said conditioning device and said bias direct current source.

11. The control device according to claim 1, wherein the at least one laser diode defines a plurality of laser diodes.

12. The control device according to claim 1, wherein: said first switching device includes programmable switches.

13. The control device according to claim 1, wherein: said first switching device is controlled using a switching signal having a low level and a high level.

* * * * *